United States Patent [19]

Milliken

[11] Patent Number: 4,610,950
[45] Date of Patent: Sep. 9, 1986

[54] METHOD OF PRODUCING PRINTING PLATES

[75] Inventor: Robert D. Milliken, Tokyo, Japan

[73] Assignee: W. R. Grace KK, Tokyo, Japan

[21] Appl. No.: 700,856

[22] Filed: Feb. 12, 1985

Related U.S. Application Data

[63] Continuation of Ser. No. 574,302, Jan. 26, 1984, abandoned.

[30] Foreign Application Priority Data

Feb. 7, 1983 [JP] Japan ............................. 58-17512

[51] Int. Cl.⁴ ............................................. G03F 7/02
[52] U.S. Cl. ..................................... 430/306; 430/396
[58] Field of Search .................. 430/302, 306, 394, 4, 430/5, 6, 396

[56] References Cited

U.S. PATENT DOCUMENTS

| | | | |
|---|---|---|---|
| 3,536,008 | 10/1970 | Ritzerfield | 101/401.1 |
| 3,615,450 | 10/1971 | Werber et al. | 96/35.1 |
| 3,651,759 | 3/1972 | Ritzerfield | 101/395 |
| 4,046,071 | 9/1977 | Mizuno et al. | 101/395 |
| 4,101,324 | 7/1978 | Mizuno et al. | 96/36.3 |
| 4,111,696 | 9/1978 | Sirlin | 430/394 X |
| 4,115,119 | 9/1978 | Okai et al. | 430/396 X |
| 4,120,721 | 10/1978 | Ketley et al. | 96/36.3 |
| 4,289,071 | 9/1981 | Hallman et al. | 101/395 |

OTHER PUBLICATIONS

Sturge, J. M., Editor, *Neblette's Handbook of Photography and Reprography* Van Nostrand Reinhold Co., New York, 1977.

*Primary Examiner*—John E. Kittle
*Assistant Examiner*—José G. Dees
*Attorney, Agent, or Firm*—John Dana Hubbard; William L. Baker

[57] ABSTRACT

A method of producing printing plates having microdots in nonimaged areas is disclosed. The method includes placing a photocurable polymer composition with oxygen inhibitor characteristics on a backing sheet and spacing an image carrier with a microdot pattern from the polymer composition and applying actinic radiation. The image carrier may additionally contain the printing image.

12 Claims, 3 Drawing Figures

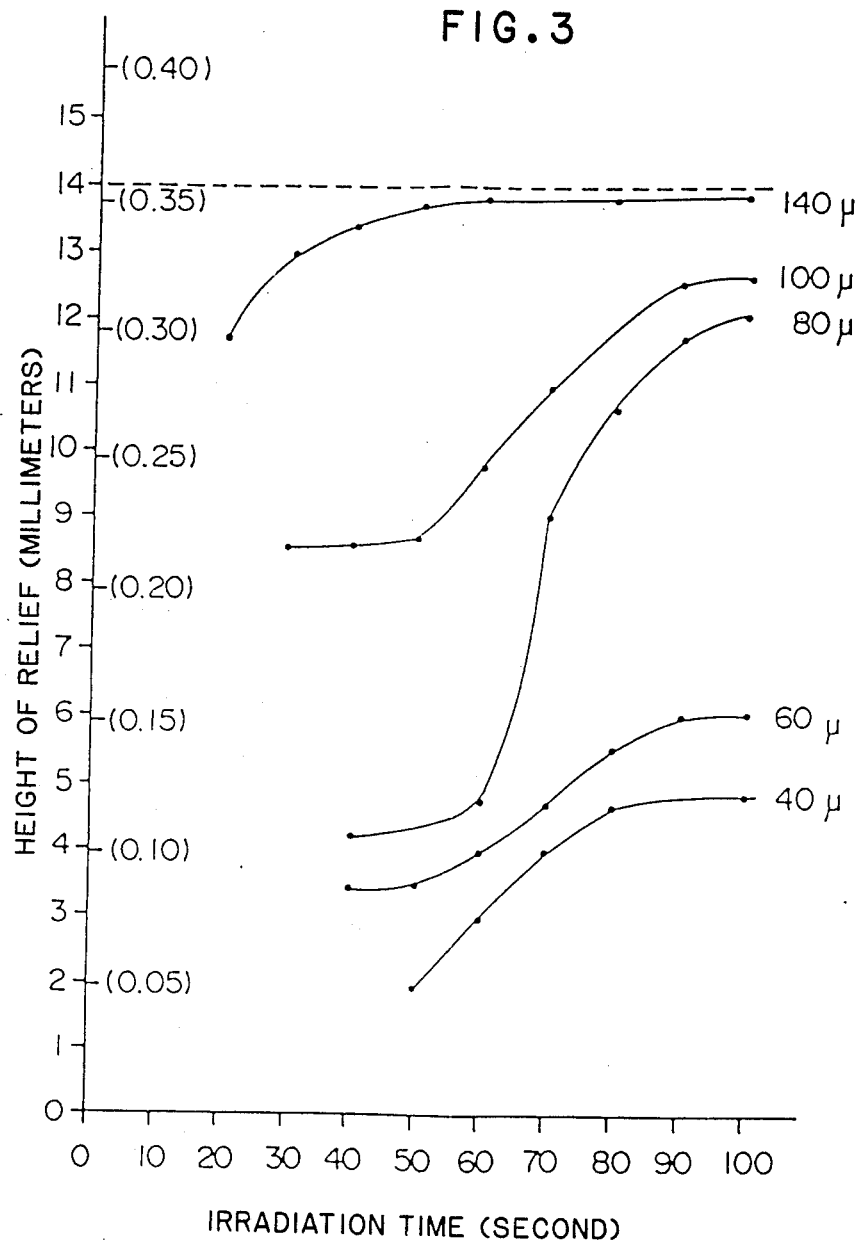

METHOD OF PRODUCING PRINTING PLATES

This is a continuation, of application Ser. No. 574,302, filed Jan. 26, 1984 abondoned.

BACKGROUND OF INVENTION

This invention relates to a method of producing printing plates. More specifically, the invention relates to a method of producing printing plates having microdots in non-image areas.

In the past various methods have been employed to prevent stains on the background, i.e. to prevent ink attached to the non-image area from staining non-printed portions of a material to be printed.

One method is to use a printing plate having a relatively high relief. Typographic printing plates of lead alloy base, or a photosensitive resin or etched metallic plates are com. As a means of preventing staining the background the relief was relatively high, e.g. 0.5 mm or higher relief.

Printing plates having relatively high reliefs have several disadvantages including difficulty in handling and fastening to a rotary printing cylinder; use of a relatively large quantity of materials with resultant high production costs; and lengthy production time. In many ways printing plates with a low relief are preferable.

A second method for preventing staining the background is to provide a printing plate with microdots. Originally, such microdots had the same height as that of the printing relief and were arranged on the total surface of a printing face of the printing plate. Therefore, what was printed using such printing plate became wholly dark. Further, in the case of printing with a colored ink, small colored spots caused by the microdots were conspicuous. The resultant printed matter was unacceptable.

As an improvement in the method for using microdots in the past it was also suggested that the height of microdots should not exceed that of the printing relief. This second method was superior to the first in that if printing working conditions were appropriate, the material was not printed with microdots. Even where such conditions were bad, the ink was only attached to a non-printed area by virtue of microdots.

Use of a transparent or semi-transparent support was also suggested. In such a method two image carriers were used. A layer of photocurable polymer composition was placed on the top of a transparent or semi-transparent backing sheet and actinic radiation was applied to the polymer composition from one side through the microdot image carrier and from the other side through the printing image carrier respectively, thereby to produce a printing plate having microdots.

This method which required two different image carriers was restricted largely by the fact that the backing sheet had to be made of a transparent or semi-transparent material. Generally, a transparent or semi-transparent plastic material such as polyethylene terephthalate, polystyrene, polycarbonate, polyvinyl chloride, polypropylene, polyvinyl alcohol, etc. was used; however, sheets formed from these materials are not always dimensionally stable. Therefore, in cases where accuracy or precision were critical this was a fatal problem. Further, when considering the heat generated by the actinic radiation, the dimensional instability was not negligible even for general printing.

Further, in the prior method of using a transparent or semi-transparent backing sheet it was necessary to bring the microdot image carrier into as close contact with a photosensitive resin layer as possible. Because of this, the above method has various problems in view of working efficiency, etc.

Moreover, with the method of making use of the above transparent or semi-transparent backing sheet there is the problem of fastening the printing plate to the printing cylinder. That is, as the suitable method of fastening the printing plate to a printing cylinder, for example, a magnetic clamping system is often used. In this method, the printing plate is attached to the rotary printing cylinder by means of a magnetic force. However, in the above described method it was necessary for the backing sheet to be transparent or semi-transparent. A transparent or semi-transparent ferromagnetic substance is not usually appropriate. Therefore, the above magnetic clamp cannot be used.

Additionally, in the method utilizing the above transparent or semi-transparent backing sheet there is a problem of temperature control of the photocurable polymer composition. To maintain exact thickness of the layer of the polymer composition or to cure such composition adequately, the temperature of the polymer composition on the top of the backing sheet must be controlled accurately. It is necessary in the method utilizing the above described transparent or semi-transparent backing sheet to apply radiation from both sides. This makes it impossible to have a temperature control device in close contact with the backing sheet. Therefore accurately controlling the temperature is difficult.

The present invention was discovered and improves the above situation. The object of the present invention is to provide a new method of producing a printing plate with microdots.

Another object of the invention is to provide a method for producing a printing plate wherein the material of the backing sheet is not restricted, thereby enabling one to use a dimensionally stable backing sheet.

A further object is to provide a method for producing a printing plate with microdots wherein it is not necessary to bring the microdot image carrier into close contact with the layer of a polymer composition, thereby providing excellent working efficiency.

Another object is to provide a method for producing a printing plate with microdots in which the backing sheet can be formed with a ferromagnetic material, so that the backing sheet can be fastened to a rotary printing cylinder using a magnetic clamp system.

A further object is to provide a method for the production of a printing plate with microdots in which accurate temperature control of photosensitive resins can be performed easily.

Another object is to provide a method for producing printing plates with only one irradiation of actinic radiation wherein said printing plate has a printing relief with adequate height and microdots with a height lower than that of the printing relief.

For a better understanding of the present invention, together with other and further objects, reference is made to the following description, taken in conjunction with the accompanying drawings and its scope will be pointed out in the appended claims.

BRIEF DESCRIPTION OF THE DRAWINGS:

FIG. 3 shows experimental data on the relation between the time of irradiation of actinic radiation and relief height.

Referring to FIGS. 1 and 2, 2 is a printing plate; 4, a printing relief; 6, a microdot; 10, a photocurable polymer composition; 14, a backing sheet; 16, an image carrier; and 18, a source of light.

DESCRIPTION OF THE INVENTION

Figure 1:
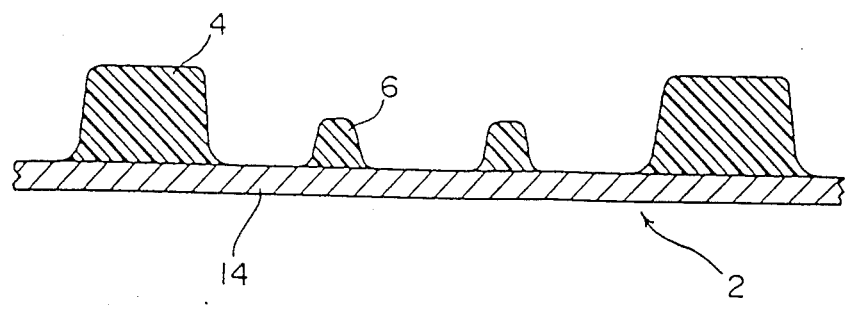
FIG. 1 is a schematic sectional view of a printing plate produced in accordance with the method of the present invention for producing printing plates.

FIG. 1 shows a printing plate comprised of a printing relief 4, a microdot 6 and a backing sheet 14 which supports both of them. The printing relief 4 and microdot 6 are formed from a photocurable polymer composition and are shown after photocuring and etching. The printing relief 4 is used to print any letter, symbol, line or the like on any material to be printed. The height of the printing relief 4 is about 14 mil (about 0.356 mm), for example, the height can be changed according to characteristics of the material to be printed, etc. The microdot 6 is preferably almost cylindrical in form and has a diameter of about 40–80 microns and a height lower than that of the printing relief 4, e.g. ⅔ times the height or less. Accordingly, if the height of the printing relief is about 14 mil (about 0.356 mm) as above, the height of the microdot is preferably about 2–9 mils (about 0.051–0.229 mm).

There are preferably about 1 to 13 microdots per square centimeter. If the density of the microdots is high they become too conspicuous. This is not preferred. On the other hand, if the density of the microdots is low, it is impossible to prevent the contamination of background adequately. The microdots are located between the centers of adjacent microdots so that the microdots can be located uniformly.

Figure 2:
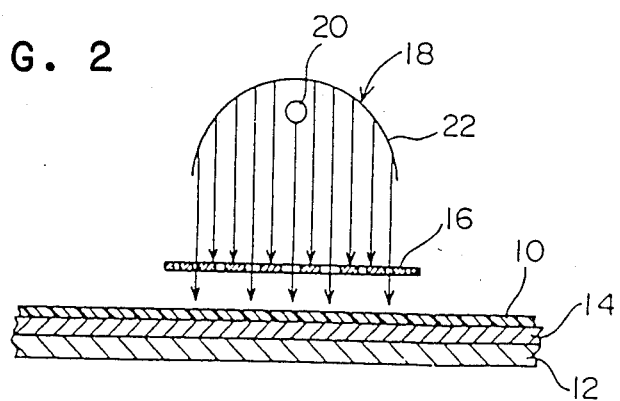
FIG. 2 is a schematic illustration of the step of applying actinic radiation in the method of the present invention.

FIG. 2 illustrates the embodiment of the above method for producing printing plates of the present invention. A photocurable polymer composition 10, a backing support base 12, a backing sheet 14, an image carrier 16 and a source of light 18 are shown.

In general the photocurable polymer composition consists predominantly of a prepolymer which is polymerized and cured by the irradiation of light and comprises a sensitizer, a retarder, a filler, etc. This photocurable polymer composition generally has a so-called oxygen inhibition characteristic wherein polymerization is inhibited when oxygen is present when actinic radiation is applied to the composition. In the case of a photocurable polymer composition which has a strong oxygen inhibition characteristic, the composition is not polymerized even on exposure to light if it touches the oxygen in the air. Therefore, when using such a polymer composition, it is usual to employ a transparent protective cover or the like to prevent the composition from touching the oxygen in the air. While, in the case of a photocurable polymer composition which is low in the above oxygen inhibition characteristic, the composition is polymerized by the exposure to light in the air if the light is sufficiently strong. However, if the light is weak, the above composition is not polymerized at all or the surface portion touching the oxygen is not polymerized but only the inner portion is polymerized.

In the method of the present invention there is used a photocurable polymer composition with a weak oxygen inhibition characteristic in an especially suitable way. An example of such polymer composition is disclosed in Japanese Patent Publication No. 46-29525 (published on Aug. 27, 1971).

For example, the above photocurable polymer composition can be formed in the following way, i.e. 678 g (0.34 mols) of polyoxypropylene glycol is degased at 100° C. for two hours and then put into a resin kettle equipped with a cooler, a stirrer, a thermometer, a gas inlet pipe and a gas outlet pipe and having a nitrogen atmosphere, said polyoxypropylene glycol having a molecular weight of about 2,025 and being commercially available by Union Carbide Corp. under the trade name of "Niax". Then 118 g (0.68 mol) of tolylene-2,4-diisocyanate is put in a kettle and the reactant is heated at 120° C. for 2¾ hours while stirring. After cooling, 58 g (1.0 mol) of allyl alcohol is added to the kettle and the mixture is heated under reflux at 120° C. for 16 hours in a nitrogen atmosphere. The kettle is allowed to stand overnight at 100° C. under vacuum and excess allyl alcohol is removed up to its trace amounts. A liquid prepolymer is taken out of the kettle, said prepolymer having a viscosity of 19,400 centipoises measured at 30° C. by using the Brookfield type viscometer and containing terminal allyl groups. This prepolymer is hereinafter termed "prepolymer A". A liquid photocurable composition is prepared by mixing 100 g (0.04 mol) of prepolymer A in 11 g (0.02 mol) of tetra(B-mercaptopropionic acid)pentaerythritol sold by Carlisle Chemical Co. under the trade name of "Q-43" and 1.5 g (0.008 mol) of reagent grade benzophenone commercially available from Fisher Scientific Co.

Alternatively, this is produced by putting 1 mol of commercially available polyoxypropylene glycol having a molecular weight of about 1,958 and a hydroxy value of 57.6 in a resin kettle equipped with a cooler, a stirrer, a thermometer and a gas inlet pipe. As the catalyst 4 g of dibutyltin dilaurate is added to the kettle together with 348 g (2.0 mols) of tolylene-2,4-diisocyanate and 116 g (2 mols) of allyl alcohol. The reaction is conducted at room temperature for 20 minutes under nitrogen. From the reaction kettle is removed excess alcohol under vacuum taking one hour. The so obtained liquid prepolymer containing a radical H₂C=CH— at the terminus has a molecular weight of about 2,400 and is hereinafter termed "prepolymer B". A liquid photocurable composition is produced by combining 100 g (0.04 mol) of prepolymer B 11 g (0.02 mol) of tetra (B-mercaptopropionic acid)pentaerythritol and 1.5 g (0.08 mol) of benzophenone.

Further, another example of the above photocurable polymer composition having a low oxygen inhibition characteristic is disclosed in Japanese Laid-Open Patent Application No. 55-27311 (laid-open for public inspection on Feb. 27, 1980).

That is, the above photocurable polymer composition can be produced in the following way, for example.

42 pounds of commercially available toluene diisocyanate is added to a 30 gallon (114 liter) glass reactor together with 15.0 g of stannous octanoate. To the reactor is added 163 g of triphenyl phosphite and then 31.4 pounds of hydroxypropyl acrylate at such rate that the temperature does not exceed 60° C. Successively, the second addition of titanous octanoate (17.0 g) is conducted and 133 pounds of propylene glycol ("PPC 1025") is added. The resultant reaction mixture is heated at 60° C. until unreacted isocyanate can be detected no longer. The so obtained acrylate terminal polyene is hereinafter termed as "prepolymer C". Then 307 pounds (139 kg) of prepolymer C is blended in 69 pounds (31.3 kg) of diethylene glycol dimethacrylate, 5.5 pounds (2.5 kg) of benzoin isobutyl ether and 627.5 g of triphenyl phosphite. This mixture is heated at 60° C. for one hour and then 7.2%, based on the total weight in the reactor, of tetramercaptopropionate ester of pentaerythritol is added, followed by adding 0.2 wt. % of octadecyl-B-(4-hydroxy-3,5-di-t-butylphenyl)propionate and 0.1 wt. % of 2,6-di-t-butyl-4-methyl phenol. Whereby the above photocurable polymer composition can be produced.

The backing support base 12 is equipped with a temperature control device (not shown) for controlling the temperature of the backing sheet 14 to be located on the above base, etc.

Optionally, the backing sheet 14 may be opaque or transparent to actinic radiation. The material for the backing sheet 14 may be a metal or a fibrous composition. Desirable materials for the backing sheet are aluminum or a paper fibrous composition. An especially preferable material for the backing sheet is a ferromagnetic one such as steel alloy so that the printing plate can be fastened to the cylinder of the printing machine depending on the magnetic clamp system. The backing sheet is in the form of a thin plate and its thickness is preferably in the range of 0.07 mm 0.30 mm.

As the image carrier 16 there can be used a negative image on a material substantially transparent to actinic radiation such as a plastic film, a sheet, a glass sheet, a cellophane, a paper or the like in addition to a photographic negative film with a silver salt image. The image carrier is so constructed that its transparent image area has a transmission concentration of 0.05 or less and its opaque emulsion area has a blackening concentration of 3.5 or more.

In this concrete example, the image carrier is provided with a microdot pattern image for forming microdots and a printing image for forming an image area. The intensity of actinic radiation applied to the polymer composition 10 through the microdot pattern image of the image carrier from the source of light is made weaker than that of actinic radiation applied to the composition 10 through a printing image of the image carrier 16 from the source of light 18. To this end, it is good to make the transmission concentration of the microdot pattern image higher than that of the printing image.

On the other hand, it is known that in a negative film for photographic purposes or the like there is a transparent area and an opaque area and when its transparency suddenly changes at the boundary between the transparent area and opaque area, this worsens the transparency of such portion in the transparent area as is near to the opaque area. By virtue of this, when a photographic negative film is prepared on the bais of circular dots having the same brightness and different diameter, the transparency of the image by the dots having a small diameter becomes worse than that of the image depending on dots of a large diameter. Because of this, when producing a photographic negative film on this basis of circular dots having a small diameter and a small area for a microdot pattern image, (i.e. for microdots) and letters having a large area, etc., the transparency of the microdot pattern image becomes worse than that of the printing image.

Further, as described below, substantially parallel actinic radiation is applied to the image carrier 16 from the source of light 18. However, this radiation is not completely parallel. As a result, actinic radiation coming through the transparent microdot pattern image portion has a very small area of the image carrier 16 and is diffused somewhat radially and the intensity of the actinic radiation per unit area becomes weak. On the other hand, actinic radiation through the printing image transparent portion has a relatively large area of the image carrier 16 and is also diffused so the intensity of the actinic radiation near the boundary of the opaque portion becomes weak. But the intensity of the actinic radiation through the central portion or inner portion of the transparent area of the image carrier will not become weak. This also enables one to make the intensity of actinic radiation through the microdot pattern image weaker than the intensity of the actinic radiation through the printing image.

The image carrier 16 of the present invention comprises a microdot pattern image and a printing image. The polymer composition 10 is irradiated with actinic radiation from the same source of light through the microdot pattern image and the printing image for the same period of time, such that the dose per unit area of actinic radiation applied to the polymer composition through the microdot pattern image is smaller than that through the printing image.

The image carrier comprising the microdot pattern image and printing image of the present invention can be prepared by using a dot generator to produce a microdot positive pattern. This positive pattern may be comprised of a plurality of circular opaque portions having a diameter of about 60 microns and be a positive film forming a rectangular grid pattern having a space between centers of the opaque portions.

A printing original is prepared, said original comprising any desired letter, photograph, etc. This printing original is a photographic paper comprising any desired letters or the like made up by a computer typesetting machine, for example. Successively, the above printing original is photographed in such state that the above microdot positive pattern is brought into close contact with an unexposed film. By virtue of this an image carrier comprising a microdot pattern image and a printing image can be produced. The above image carrier can be also produced by bringing the microdot positive pattern and a positive film of the printing original into close contact with an unexposed film.

In an alternate embodiment of the image carrier there can be used two image carriers, i.e. a first image carrier with only the microdot pattern image located thereon and a second image carrier with only the printing image located thereon. In this case, the amount of actinic radiation going through the microdot pattern image can be made smaller than that going through the printing image, for example, by making the time of irradiation through the first image carrier shorter than that through the second image carrier.

The microdots of the pattern image of said image carrier 16 are preferably circular and have diameters of 40 to 80 microns. If the diameter of the microdots is more than about 80 microns, the printed points depending on microdots are too large and become conspicuous. This is not preferred. Further, if the diameter is less than about 40 microns, appropriate microdots cannot be generally formed or microdots cannot be generally formed at all on the ground that the close density of actinic radiation transmitted is too small, etc. However, the shape and size of the above transparent portions can be varied adequately depending on the characteristics of the materials to be printed or those of the polymer composition. They are not restricted by the above description.

Transparent portions in the microdot pattern image of the image carrier 16 are preferred if located in a rectangular grid pattern having a space between its centers of approximately 6 millimeters. If the density of the transparent portion is too high, the whole of the printed portion becomes dark. This is not preferred. Further, if its density is too low, this renders it impossible to prevent staining the background, the original object. From such point of view, it is preferable to locate the transparent portions in such a rectangular grid pattern that the space between centers of the nearest transparent portions may be about 6 mm.

The source of light 18 comprises a source of actinic radiation 20 and a reflector 22. Ultraviolet radiation or high-energy ionization radiation can be used. Ultraviolet radiation can be obtained from a solar light beam or a source of light which emanates a significant quantity of ultraviolet rays having a wavelength of about 2,000 to about 4,000 angstrom units. Any of these types of actinic radiation can be used. In this concrete example the light is emanated in the form of substantially parallel beams from the source of actinic radiation 20. However, it is also possible to use a beam of light. Suitable examples of the source of actinic radiation 20 includes a carbon arc, a mercury arc, a fluorescent lamp having a phosphorescent material which emanates special ultraviolet rays, a Xenon arc, solar beam light, a tungsten halide lamp, an argon glow lamp, a photographic flood lamp, and laser beam light. When using ultraviolet radiation in the curing reaction it is generally used in an amount of radiation of 0.0004–60 watt/cm$^2$.

Next, there will be explained concrete example of the method of this invention according to respective steps, said method for producing a printing plate with microdots in non-image areas.

Firstly, a photocurable polymer composition 10 is placed on the backing sheet 14. This can be done by known discharge and doctoring mechanisms such that the relief height of the polymer composition can be controlled accurately. The thickness of the polymer composition 10 on the backing sheet 14 is about 14 mil (about 0.356 mm).

Successively, an image carrier 16 is positioned parallel to and preferably spaced apart from the polymer composition 10 such that an air gap is formed. According to this example, the image carrier comprises a microdot pattern image and a printing image.

The source of radiation 18 is so arranged that substantially parallel actinic radiation is applied vertically to the image carrier. The source of radiation is actuated for a predetermined period of time and the actinic radiation is applied to the polymer composition through the image carrier. Since each of the above steps is usually conducted in the atmosphere and the image carrier is usually spaced apart from the polymer composition the outside surface of the polymer composition on the backing sheet 14 is in contact with the air, i.e. the oxygen in the air, at the time of exposure to actinic radiation.

If the polymer composition contacts the oxygen at the time of exposure to actinic radiation, it has an oxygen inhibition characteristic. By virtue of this characteristic the curing of the polymer composition is inhibited. The portion of the polymer composition close to the outside surface is more susceptable to inhibition than is the inner portion.

The portion of the polymer composition sufficiently exposed to actinic radiation, i.e. the portion exposed to a large amount of radiation, is cured by overcoming the oxygen inhibition. The portion of the outside surface which has a notable tendency to be inhibited is also cured by exposure to a sufficient amount of radiation.

The portion receiving a small amount of radiation is such that the outside surface portion has a notable trend wherein the curing is inhibited and the polymer is not cured but the inner portion with such small tendency is cured.

By virtue of this the portion of the polymer composition irradiated through the printing image is cured up to its outside surface portion. On the other hand, the portion irradiated through the microdot pattern image is such that its outside surface portion is not cured but only the inner portion is cured. Of course, the portion not irradiated with actinic rays because of its being opaque portion of the image carrier is not cured at all.

The uncured portion of the polymer composition on the backing sheet can be removed by dissolving it in an aqueous solution of a surfactant, an aqueous alkaline solution or an organic solvent such as alcohol, acetone, benzene, trichlene, etc. Or the uncured portion removed using vacuum suction, centrifugal force or pressurized air. Moreover, the portion which was irradiated with actinic radiation but was not sufficiently cured because of the oxygen inhibition characteristic can be removed effectively. In this way the height of microdot 6 effectively can be made lower than that of the printing relief 4.

In the case where the photocurable polymer composition is placed on the backing sheet and then polymerization inhibition activity is not imparted without bringing oxygen into contact with the outside surface of the polymer composition 10, if applying actinic rays sufficiently to form microdots. This causes a polymerization in the portion near to the outside surface of the polymer composition 10 and cures such portion, whereby it is impossible to produce microdots having a height lower than that of the printing relief.

On the other hand, in the case of applying a small quantity of actinic radiation to form microdots no polymerization occurs at all or incomplete polymerization occurs from the portion near to the outside surface of the polymer composition 10 to the portion approximate to the backing sheet. Accordingly, the uncured portion is removed completely in the step of removing such portion as described above and no microdots are formed at all.

It is preferably that after the printing plate is treated adequately in each step in the above way and then the uncured resin is removed, a blotting roller or a blotting paper is used to wipe out the residual uncured resin and moreover the plate is subjected to post-exposure, thereby increasing the strength of the cured resin. Thus, it is possible to produce a printing plate having microdots as shown n FIG. 1.

In the above example, there is used a photocurable polymer composition having a low oxygen inhibition. This makes it possible to form microdots having a lower height than that of the printing relief by bringing oxygen into contact with the outside surface of the polymer composition placed on the backing sheet.

Instead of this a photocurable polymer composition having a high oxygen inhibition characteristic can be employed as a second example of a polymer composition suitable for use in the present invention. In this case it is sufficient to conduct the above individual steps in an atmosphere wherein oxygen is present in trace amounts.

In FIG. 3 experimental data is shown on the radiation and height of the cured portion.

375 g of commercially available toluene diisocyanate was added to a 3 liter glass resinous bottle together with 0.295 g of stannous octoate. Then 308.8 g of commercially available hydroxypropyl methacrylate was added to the mixture at such rate that the temperature may not exceed 60° C. After the completion of this addition the reaction mixture was heated at 60° C. for one hour and then 0.31 g of stannous octoate was further added thereto. Successively 1288.2 g of polypropylene glycol ("PPG1025", a product of Union Carbide) having a molecular weight of 1,000 was added to the mixture and was heated at 60° C. for three hours until its NCO content was lowered to at most trace amounts. To this was added 1.97 g of 2,6-di-t-butyl phenol stabilizer. A methacrylate terminal polyene was obtained and is hereinafter termed "prepolymer D".

803 parts of prepolymer D blended in 281 parts of diethylene glycol dimethacrylate, 8.7 parts of triphenyl phosphite, 10.9 parts of 2,2-dimethoxy-2-phenylacetophenone, 2.2 parts of 2,6-di-t-butyl phenol and 54 parts of trimethylolpropane tris(3-mercaptopropionate). This mixture was then heated at 60° C. for one hour and a photocurable polymer composition was obtained.

A layer of this photocurable polymer composition having a thickness of 14 mil (about 0.356 mm) was knife coated onto an aluminum sheet having a thickness of 10 mil (about 0.254 mm) coated with an adhesion accelerating layer.

A first positive pattern was prepared by using a dot generator, said positive pattern having a plurality of circular opaque portions with a diameter of 40 microns arranged at sufficient intervals. Similarly second to fifth positive patterns were prepared including a plurality of circular opaque portions each of which had a diameter of 60 microns, 80 microns, 100 microns and 140 microns. These five sheets of positive patterns were brought into close contact with a lith type film of Eastman Kodak Company, respectively. Using a chemical lamp 20 W of Tokyo Shibaura Electric Co., Ltd., the above film was exposed to 10 seconds at a distance of 10 cm. Then the film was developed using a so-called automatic developing machine. There resulted five kinds of image carriers each having a microdot pattern image. A 8 KW xenon lamp was used as the source of light and also a reflector for making the light from the xenon lamp substantially parallel.

The image carrier and the outside surface of the polymer composition coated in the above way were so placed that they are parallel to each other and a space between both of these has a clearance of about 15 mil (about 0.381 mm). By actuating the source of light the polymer composition was irradiated through the image carrier. Further, the measured value of irradiation intensity was about 3.4 mW/cm$^2$, said measured value being determined through a filter permeable to ultraviolet rays having 300–400 nm. The time of irradiation was changed in the range of 10 seconds to 100 seconds at an interval of 10 seconds. These steps were conducted in atmospheric environment.

According to the above experiment, the results shown in FIG. 3 were obtained. For instance, a showing of no result when the time of irradiation was 40 seconds or less in case of the diameter of 40 microns means that no microdots were produced at all. The broken line indicates the height [14 mil (about 0.356 mm)] of a liquid polymer composition measured at the time of coating it onto the aluminum backing sheet.

Transparent portions of the image carrier for printing image forming letters or the like have a larger area than that of circular transparent portions having a diameter of 140 microns. Accordingly, if a printing relief is produced by causing actinic radiation to permeate through transparent portions of the printing image under the same conditions as those in the above experiment, this printing relief will have at least the same height as that of a relief by the above circular transparent portion with a diameter of 140 microns. If a photocurable composition is irradiated for 70 seconds through the image carrier comprising a half-tone image formed by a multiplicity of said transparent portions with a diameter of 80 microns and a printing image under the same conditions as above, a printing plate is produced having a microdot of the height of about 9 mil (about 0.229 mm) and a printing relief of the height of about 14 mil (about 0.356 mm).

What is claimed:

1. A method of producing printing plates possessing microdots in non-image area comprising a photocurable polymer composition having oxygen inhibition characteristics on top of a backing sheet; placing an image carrier having a microdot pattern image and a printing image, adjacent but spaced apart from the polymer composition; and applying actinic radiation to the polymer composition in an oxygen-containing atmosphere through the image carrier.

2. A method as set forth in claim 1 wherein the microdot pattern image of said image carrier is formed in circular transmission areas each having a diameter of about 40 to 80 microns and said transmission area is located in a rectangular grid pattern having a space between centers of approximately 6 millimeters.

3. A method as set forth in claim 1 wherein the backing sheet is selected from the group consisting of metals and fibrous compositions.

4. A method as set forth in claim 1 wherein said polymer composition is placed on said backing sheet by a discharge and doctoring mechanism to accurately control the relief height and thus allow said image carrier to assume close proximity without touching said polymer composition.

5. A method as set forth in claim 1 wherein the image carrier comprising both a microdot pattern image and a printing image is formed by overlapping the printing image with a microdot positive pattern and exposing an unexposed film to the overlapped microdot positive pattern and printing image.

6. A method for producing a printing plate having microdots in non-image areas comprising: laying a photocurable polymer composition on a backing sheet; positioning an image carrier, having a microdot image and a printing image, parallel to and spaced apart from the polymer composition so as to form an air gap between the image carrier and the polymer composition; applying substantially parallel actinic radiation to the polymer composition through the image carrier to selectively cure the polymer composition in areas where the actinic radiation passes through the image carrier; and removing unexposed polymer composition.

7. A method as set forth in claim 6 wherein the image carrier comprising both microdot pattern image and printing image is formed by overlapping the printing image with a microdot positive pattern and exposing an unexposed film to the overlapped microdot positive pattern and printing image.

8. The method of claim 6 wherein the photocurable polymer composition has a low oxygen inhibition property.

9. The method of claim 6 wherein the polymer composition is exposed to the actinic radiation in an oxygen-containing atmosphere.

10. A method of claim 6 wherein the microdot image of the image carrier is formed in circular transmission areas, each having a diameter of about 40 to about 80 microns and the transmission areas are located in a rectangular grid pattern having a spacing between adjacent areas of about 6 millimeters.

11. A method of claim 10 wherein the spacing between the adjacent areas is measured from center to center of the adjacent areas.

12. A method of claim 6 wherein the image carrier having both a microdot image and a print image is formed by overlapping the print image with the microdot image and exposing an unexposed film to the overlapped microdot image and print image.

* * * * *